United States Patent [19]

Keyes

[11] 4,358,745
[45] Nov. 9, 1982

[54] SEMICONDUCTOR SURFACE ACOUSTIC WAVE DEVICE

[75] Inventor: Robert W. Keyes, Ossining, N.Y.

[73] Assignee: International Business Machines Corporation, Armonk, N.Y.

[21] Appl. No.: 244,196

[22] Filed: Mar. 16, 1981

[51] Int. Cl.³ .................... H03H 9/42; H03H 9/64; H01L 21/02
[52] U.S. Cl. .................. 333/155; 310/313 A; 333/195; 357/26
[58] Field of Search .................. 333/150-155, 333/193-196; 357/26; 310/313 R, 313 A, 313 B, 313 C, 313 D; 330/4.9, 5.5; 29/25.35; 331/107 A

[56] References Cited

U.S. PATENT DOCUMENTS 4,110,653  8/1978  Hartemann .................... 333/195 X

OTHER PUBLICATIONS

IBM TDB, vol. 23, No. 2, Jul. 1980, p. 837.
IBM TDB, vol. 13, No. 10, Mar. 1971, p. 3022 and 3023.
Applied Physics Letters, vol. 15, No. 12, 15 Dec. 1969, pp. 403 to 405.
IEEE 1979 Ultrasonics Symposium Proceedings, pp. 637 to 640.
IBM TDB, vol. 13, No. 8, 1971, p. 2435.
IEEE 1975 Ultrasonics Symposium Proceedings, pp. 232 to 233.
IEEE 1973 Ultrasonics Proceeding, pp. 333 to 335.
IBM TDB, vol. 13, No. 11, Apr. 1971, p. 3224.
Proc. IEEE, vol. 58, 1970, pp. 1361 and 1362.
Physical Review, vol. 132, No. 6, 15 Dec. 1963, pp. 2434 to 2440.
Applied Physics Letters, vol. 2, No. 1, 1 Jan. 1963, pp. 1 to 3.
IBM Journal, Oct. 1961, pp. 266 to 278.
Physical Review Letters, vol. 7, No. 2, Jul. 15, 1961, pp. 55 and 56.
Solid State Physics, vol. 20, 1967, pp. 37 to 90.
Physical Review, vol. 161, No. 3, 15 Sep. 1967, pp. 756 to 761.

*Primary Examiner*—Marvin L. Nussbaum
*Attorney, Agent, or Firm*—Alvin J. Riddles

[57] ABSTRACT

Surface acoustic wave devices with selectable performance parameters such as having a temperature coefficient of zero, may be fabricated employing a monocrystalline semiconductor substrate with a combination of appropriate doping and crystallographic orientation both with respect to the surface and the direction of propagation. Monocrystalline silicon doped with phosphorous to the order of $2 \times 10^{19}$ atoms per cc, exhibits a zero temperature coefficient at 300° Kelvin for acoustic waves propagating in the [1$\bar{1}$0] crystallographic direction on a [110] substrate.

10 Claims, 6 Drawing Figures

SEMICONDUCTOR SURFACE ACOUSTIC WAVE DEVICE

DESCRIPTION

Technical Field

The technical field of the invention is that of surface wave devices. In such devices, an electromagnetic signal is converted to an acoustic signal on the surface of a substrate. Surface wave devices combined with other solid state electronic elements can be used for such purposes as filtering and delaying signals.

Background Art

Most surface wave devices heretofore in the art have employed piezoelectric substrates. The devices have been used in such applications as band pass filters, dispersive delay lines, and surface wave resonators. In such devices an electrical signal applied to an interdigital transducer on the substrate is converted to a propagating wave which carries vibrational energy parallel to the free surface of the substrate.

Attention has been directed in the art to the finding of appropriate materials for surface wave devices that will ease performance constraints. The devices are particularly sensitive to temperature which affects the dimensions of the device, their reproducibility and the conditions under which they are to be operated.

One illustration is U.S. Pat. No. 4,110,653 wherein a piezoelectric crystal of quartz is crystallographically oriented and subjected to ion bombardment to provide temperature sensitivity control.

Another illustration is Proc. IEEE, 58, p. 1361 (1970) wherein a small temperature coefficient is achieved in quartz by a specific crystallographic orientation.

Since additional electronic circuitry is needed to utilize surface wave devices, efforts have been directed to integrate them with semiconductor devices. Structures have appeared in the art with variations in the interdigital transducer construction as shown in IBM Technical Disclosure Bulletin, 13, No. 10, March 1971, p. 3022 and 3023 and IBM Technical Disclosure Bulletin, 23, No. 2, July 1980, p. 837. Structures to control a property such as temperature sensitivity such as illustrated in IEEE 1979, Ultrasonic Symposium Proceedings, pp. 232 and 233 have appeared in the art.

Surface wave devices heretofore in the art, have not been integrated with other electronic devices on a monolithic semiconductor substrate.

DISCLOSURE OF THE INVENTION

Figure 1:
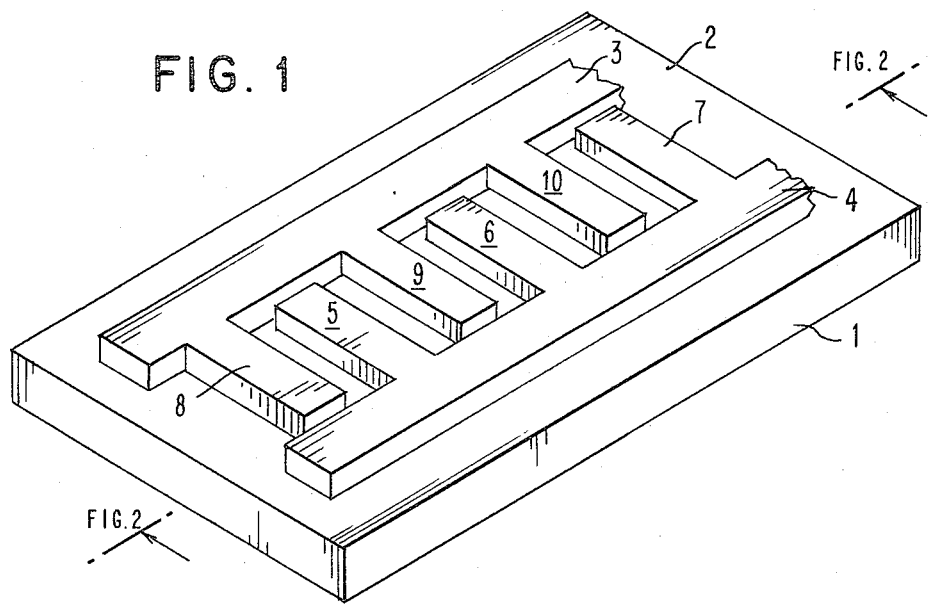
FIG. 1 is a schematic illustration of a surface wave device.

Semiconductor surface acoustic wave devices with precisely predictable and dependable performance are provided by positioning the interdigital transducer on a crystal having a specific doping level on a surface having a particular crystallographic orientation with a specific crystallographic direction of surface wave propagation. The doping introduces anomalous temperature dependence into the elastic constants of the semiconductor material.

Normally, the elastic constants of semiconductor material will decrease with increasing temperature. In accordance with the invention, the shear elastic constant can be made with appropriate doping to increase, with temperature. A semiconductor crystal that is appropriately doped and appropriately crystallographically oriented both with respect to the surface and with respect to the direction of wave propagation can be caused to have surface acoustic wave transit time variation with temperature vanish and/or pass through zero and reverse direction at a particular temperature.

Semiconductor material and particularly silicon, is the material used in all of solid state electronics so that the invention enables embodying temperature compensated acoustic wave devices and other circuitry in a single homogeneous substrate. Since the acoustic wave transmission properties are properties of the crystal, reliability and reproducibility are assured.

In semiconductor material doping produces an electronic contribution that has an effect on at least one elastic constant of the crystal. The velocity of an acoustic wave in turn is affected by both the magnitude of the elastic constants and the direction of propagation of the wave.

All of the elastic constants of a crystal influence the velocity of a surface acoustic wave in any direction. However, certain guidelines are available. The surface acoustic waves have a large component of displacement perpendicular to the surface, and a favorable crystal orientation is, therefore, one in which the corresponding bulk transverse shear wave is strongly influenced by the electronic effect. In silicon the wave traveling in a [110] direction with displacement in [1$\bar{1}$0] direction is controlled by the elastic constant $C_{11}-C_{12}$ in which there is a large electronic effect and one is led to study the [110] [1$\bar{1}$0] surface wave. The doping concentration is limited by the fact that concentrations less than $10^{19}/cm^3$ have little effect on the temperature dependence of elastic constants at 300° K.

In accordance with the invention, selection of the properties of semiconductor surface wave transducers requires control over both the magnitude of the electronic contribution to the elastic properties of the crystal and to the direction and to provide this control, appropriate doping and crystallographic orientation in two directions, is provided.

The electronic contribution to the elastic properties occurs as a result of different mechanisms in different semiconductor types. In multivalley type semiconductors such as silicon, germanium and gallium phosphide wherein there are several regions of minimal energy level, the conductivity type is n produced by doping in the range of $10^{18}$ to $10^{21}$ with donors. In semiconductors of the type having near degenerate band structures, the doping would be with acceptors in a similar range.

The electronic contribution to the parameters of propagation of an elastic wave depend on crystallographic orientation. It is necessary to select a crystallographic orientation for the surface that will provide an appropriate magnitude of the electronic contribution. The propagation direction of the waves will be parallel to the surface and an appropriate crystallographic orientation can be selected. The crystallographic orientation of both the surface and the direction of propagation in the surface are interrelated, and may be different for different materials.

It has been found that semiconductor materials under proper doping conditions have surface acoustic wave performance that has controllable velocity values with respect to temperature. The effect of doping arises from energy effects related to the semiconductor energy band structure and piezoelectric effects are not involved.

BEST MODE OF CARRYING OUT THE INVENTION

Referring to FIG. 1 a schematic is provided of a transducer which performs one part of the function of an interdigital transducer surface wave device when the substrate is an appropriately doped and crystallographically oriented semiconductor crystal. In accordance with the invention, the substrate 1 is a semiconductor crystal such as silicon. The crystal 1 is crystallographically oriented in two directions. The first direction is normal to a surface 2 on which the interdigital transducer is positioned and the second direction is the direction of acoustic wave propagation which is parallel to the surface 2.

On the surface 2 of the crystal there are placed at least two interdigital transducers of which only one is shown. The transducer has interdigitated conductors 3 and 4, each in turn having fingers 5, 6 and 7 and 8, 9 and 10, respectively. In such structures a piezoelectric or oxide layer not shown, separates the parts of the interdigital transducer from the surface of the crystal. The period of the comb structure of the interdigital transducer determines the acoustic wavelength.

In operation an alternating current or AC signal between elements 3 and 4 introduce acoustic waves into the crystal 1 and these waves propagate parallel to the surface 2. The AC signal has a frequency $f = V_s/L$ where $V_s$ is the velocity of the wave and L is the period of the interdigital transducer comb.

The elements 3 and 4 are conductive stripes of metal or polysilicon formed by standard semiconductor industry techniques such as lithographic, so that the width and separation dimension for the fingers is of the order of 1 micron.

It will be apparent to one skilled in the art that in this highly developed field the structure of FIG. 1 is schematic with only the relationship of a portion of the interdigital transducer sufficient to illustrate the requirements of doping and crystallographic orientation of the invention and that since semiconductor compatibility is achieved, other circuitry not shown may be provided elsewhere on the substrate.

In accordance with the invention it has been found that the performance of the crystal 1 with respect to the variation of the transit time of the waves can be selected by appropriate doping and appropriate related crystallographic orientation between the direction normal to the crystal as represented by arrows 11 and 12 and the direction the waves take within the crystal as represented by arrows 13 and 14. A particularly valuable ability to selectively tailor the performance of the crystal of an acoustic surface wave device with respect to temperature response is achieved. Such capability permits the achieving of valuable circuit and design parameters in the fabrication of electrical apparatus in integrated form.

Since the performance of the surface wave device is dependent upon the time delay of propagation through the crystal matrix, it will be apparent that changes in dimension and elastic constants such as are produced by temperature change, will alter performance both by changing the velocity of propagation of the waves and by changing the actual substrate dimensions.

In accordance with the invention there is provided an approach to the control of the interrelated parameters of semiconductor material, doping and crystallographic orientation that permits reducing variations of transit time with temperature.

In accordance with the invention a semiconductor exhibits the property that the doping concentration will affect the elastic properties of the crystal. The elastic properties of the crystal and the crystallographic orientation of both the semiconductor surface and direction of propagation affect the velocity. A semiconductor doping level and crystal orientation can, in accordance with the invention, be specified so that a change in transit time of a surface wave between two points reverses at a particular temperature and at that temperature the temperature coefficient is zero.

Figure 2:
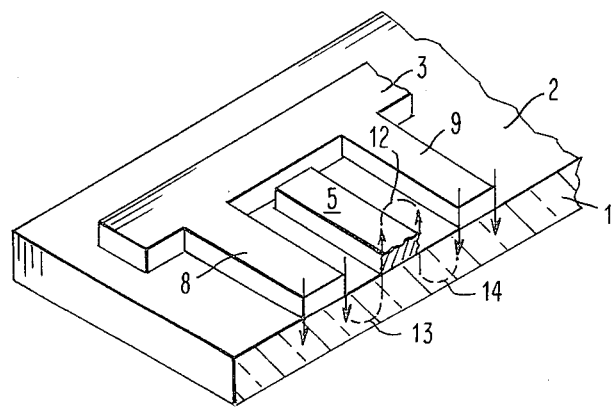
FIG. 2 is a schematic cross section of FIG. 1 showing the wave direction in a semiconductor crystal substrate.

The semiconductor material silicon, doped with phosphorous donors in a quantity of $2 \times 10^{19}$ atoms per cc will exhibit a zero temperature coefficient when the crystallographic orientation, referring to FIG. 2 of the arrows 11 and 12 normal to the crystal surface 2, is the $[1\bar{1}0]$ direction and the crystallographic orientation parallel to the surface is the $[110]$ direction.

The influence of doping and crystallographic orientation on the transit time of surface waves in an illustrative semiconductor crystal of silicon may be seen from the graphs of FIGS. 3-6 which are provided to illustrate in accordance with the invention, the parameters involved. The measurements were made in accordance with the teachings of Hall, reported in Physical Review, Vol. 161, No. 3, pp. 756-761, 15 Sept. 1967.

Figure 3:
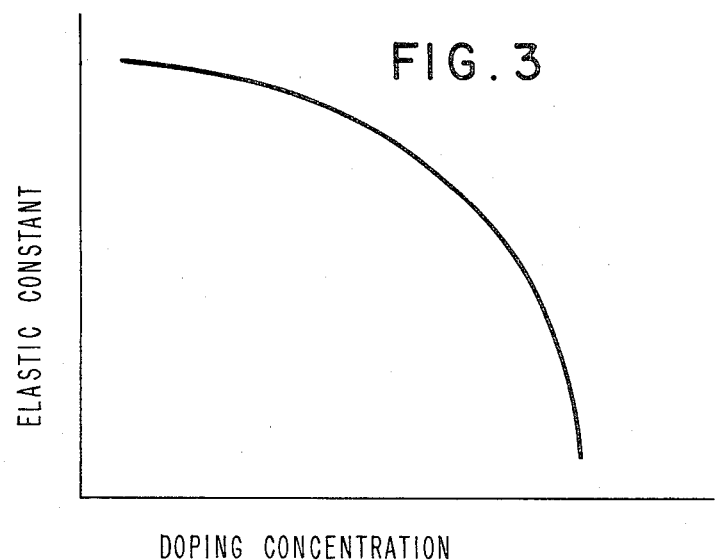
FIG. 3 is a graph illustrating the effect of doping concentration on one elastic constant of a multivalley semiconductor crystal.

Referring to FIG. 3, a graph is provided showing the nonlinearity of the effect of doping concentration on one elastic constant of a conductor crystal. The effect is a rather sharp reduction in the elastic constant value with increasing doping concentration.

In accordance with the invention a preferred material is silicon and the specific values of the change in elastic constant in accordance with the curve of FIG. 3 are shown in Table 1 wherein the constant varies from 1.66 to 1.54 during a change in doping density from $1 \times 10^{18}$ to $1 \times 10^{21}$.

A doping level change of 0.12% will decrease the elastic constant in silicon by 2.5%.

TABLE 1

| Silicon | |
|---|---|
| ELASTIC CONSTANT | DOPING LEVEL PHOSPHOROUS |
| $C_{11}$ ($10^{12}$ dynes/cm$^3$) | Atoms/cc |
| 1.66 | $1 \times 10^{18}$ |
| 1.64 | $1 \times 10^{19}$ |
| 1.59 | $1 \times 10^{20}$ |

TABLE 1-continued

| Silicon | |
|---|---|
| ELASTIC CONSTANT | DOPING LEVEL PHOSPHOROUS |
| 1.54 | $1 \times 10^{21}$ |

Figure 4:
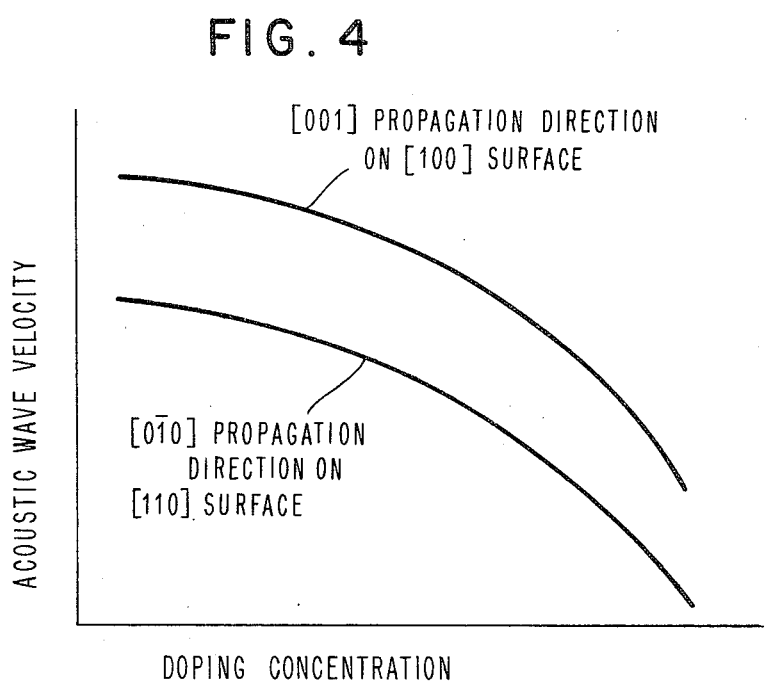
FIG. 4 is a graph showing the effect of doping concentration on the acoustic wave velocity at different crystallographic orientations.

A graph is provided in connection with FIG. 4 which illustrates the effect of crystallographic orientation on the variation of wave velocity with doping concentration for different crystallographic orientations. The curves follow essentially parallel paths wth different velocity magnitudes.

The type of information provided in connection with the graph of FIG. 4 will permit one skilled in the art to select a wave velocity for a particular doping concentration constraint, since with one crystallographic orientation a higher velocity is achieved than with another.

With respect to the preferred material silicon, data is provided in Table 2 illustrating specific wave velocities with crystallographic orientation for varying specific doping levels.

TABLE 2

| Silicon | | |
|---|---|---|
| WAVE VELOCITY IN Cm/SECOND | | DOPING LEVEL PHOSPHOROUS Atoms/cc |
| [001] Direction on [100] Surface | [110] Direction on [110] Surface | |
| 4900 | 4500 | $1 \times 10^{18}$ |
| 4850 | 4450 | $1 \times 10^{19}$ |
| 4700 | 4300 | $1 \times 10^{20}$ |
| 4600 | 4100 | $1 \times 10^{21}$ |

Figure 5:
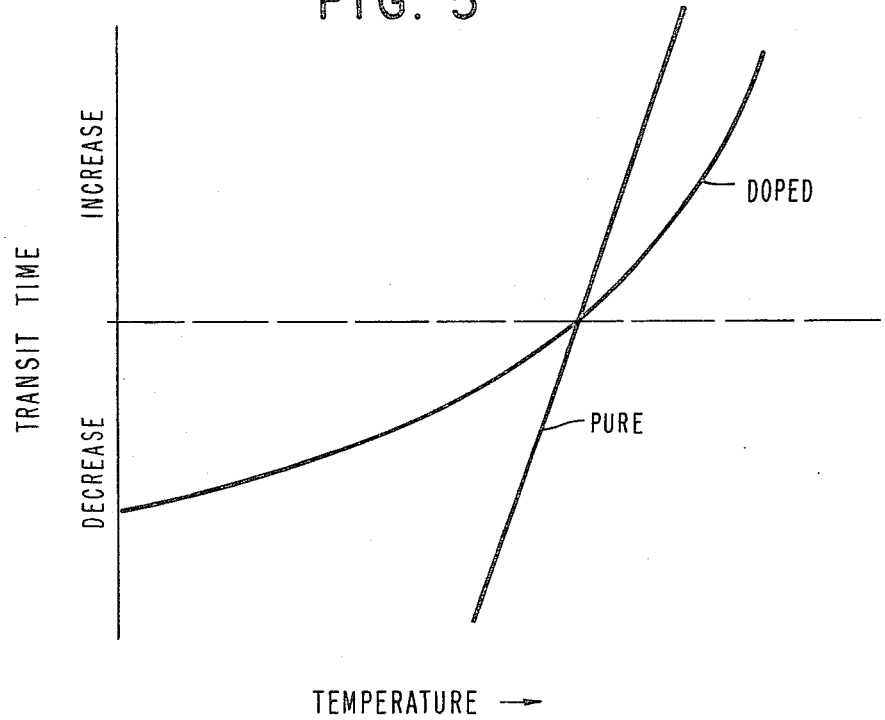
FIG. 5 is a graph showing the variation in transit time with temperature for surface acoustic waves in doped and in pure semiconductor material.

Referring now to FIG. 5 wherein the difference in variation with temperature of the transit time of surface waves in both a doped and a pure crystal is linear with a steep slope whereas for a doped crystal the variation is not linear and the slope is not as steep. Data, with respect to the material silicon, is set forth in Table 3.

TABLE 3

| Silicon | | |
|---|---|---|
| Δ TIME INCREASE IN TIME IN PARTS PER MILLION | TEMPERATURE DEGREES KELVIN | ORIENTATION WAVE DIRECTION ON SURFACE ORIENTATION |
| −2500 | 200 | [100] on [1̄10] Pure and [001] on [100] Pure |
| −1300 | 250 | |
| 0 | 300 | |
| +1400 | 350 | |
| −1000 | 200 | [100] on [001] doped |
| −600 | 250 | |
| 0 | 300 | |
| +700 | 350 | |

In accordance with the invention the doping concentration together wth crystallographic orientation may be selectively employed to provide a crystal where variation in transit time passes through zero or changes direction at a particular temperature and thereby provides a crystal with a zero temperature coefficient.

Figure 6:
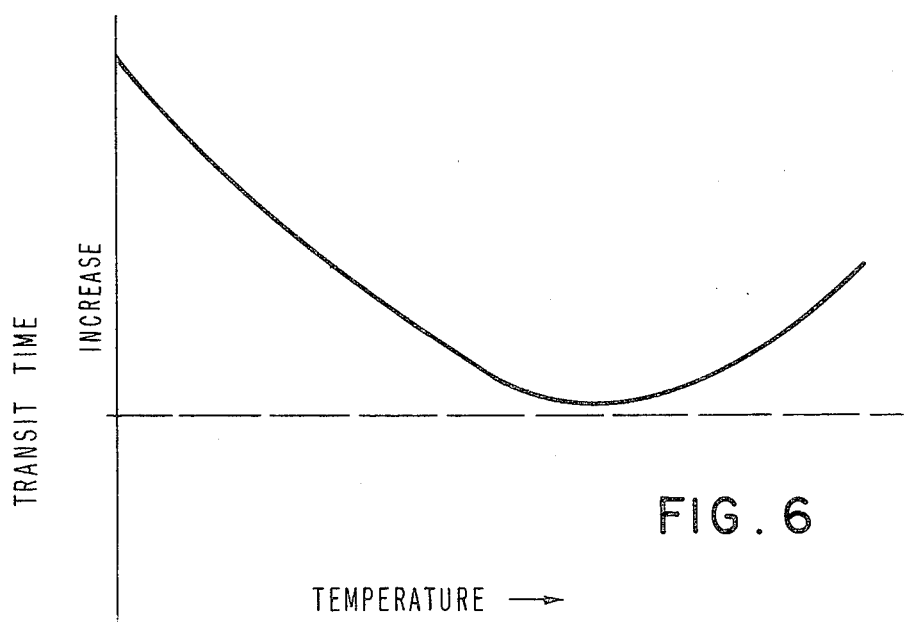
FIG. 6 is a graph of the variation of transit time of surface waves in a multivalley semiconductor crystal having related crystallographic orientation and doping showing the variation passing through zero at a selected temperature.

This is illustrated in the graph of FIG. 6 wherein the transit time variation passes through zero and changes direction at a specific temperature.

It will be understood that in the light of the illustration of the interrelationship of doping and crystallographic orientation, one skilled in the art may by proper selection of the doping concentration and the two crystallographic orientation parmeters reduction of the variation of transit time with temperature may be provided.

With respect to the preferred material silicon, data is provided in Table 4 for a crystal exhibiting a zero temperature coefficient at 300° Kelvin wherein the doping is phosphorous at a density of $2 \times 10^{19}$ atoms per cc and the crystallographic orientation normal to the surface is the [1̄10] direction and the crystallographic orientation in the direction of propagation is the [110] direction.

TABLE 4

| Silicon | | |
|---|---|---|
| Δ TIME INCREASE IN TIME IN PARTS PER MIN. | TEMPERATURE DEGREES KELVIN | ORIENTATION WAVE DIRECTION ON SURFACE OREINTATION |
| +800 | 200 | [110] on [1̄10] Doped |
| +300 | 250 | |
| 0 | 300 | |
| +150 | 350 | |

What has been described is a selective performance parameter surface acoustic wave device that can be integrated in a monolithic substrate with semiconductor signal processors. The surface wave device employs the interrelated criteria of doping and of two directional control of crystallographic orientation to provide control of transit time and selectable temperature performance.

Having thus described my invention, what I claim as new, and desire to secure by Letters Patent is:

1. In a device wherein semiconductor signal processing and surface wave propagation are employed in single substrate the improvement for surface wave propagation to eliminate the use of multi-material substrates comprising a monolithic semiconductor material substrate having a surface orientation and a direction of propagation in which said surface wave velocity is affected by doping with at least one of donors and acceptors, and a doping level in at least a region of said substrate operable to reduce the effect of temperature on the propagation time of a surface acoustic wave in said semiconductor material.

2. A surface acoustic wave semiconductor device having a reduced variation with temperature of propagation time of surface acoustic waves comprising:
a monolithic semiconductor material substrate
having both a surface orientation and a direction of propagation in which the velocity is affected by impurity doping, and
having a doping level that reduces the effect of temperature on the propagation time of surface acoustic waves in said semiconductor.

3. The device of claim 2 wherein the substrate material is a multivalley semiconductor.

4. The device of claim 2 wherein the substrate is a degenerate band p-type semiconductor.

5. The device of claim 3 wherein said substrate is n-type silicon doped in the range of $10^{18}$–$10^{21}$ atoms/cc.

6. The device of claim 5 wherein said dopant is phosphorous at a level of $2 \times 10^{19}$ and said substrate crystallographic orientation is [1̄10] with respect to the surface and [110] with respect to the direction of wave propagation.

7. A method of reducing the effect of temperature on the propagation time of surface acoustic waves in a semiconductor material comprising:

selecting a surface orientation and a direction of propagation in said semiconductor material in which the velocity of surface wave propagation is affected by impurity doping; and providing impurity doping in a region of said semiconductor material at a level operable to reduce the effect of temperature on the propagation time of a surface acoustic wave.

8. The method of claim 7 wherein said semiconductor material n-type is silicon, said surface orientation is the [110] direction, said direction of propagation is the [1$\bar{1}$0] direction and said impurity doping is of the range of $10^{18}$ to $10^{21}$ atoms per cc.

9. A semiconductor device comprising a monolithic substrate having at least in a first region semiconductor signal processing capability and having at least in a second region surface acoustic wave propagation capability said acoustic wave propagation capability comprising a crystalline orientation both with respect to the direction of propagation of surface waves and a surface of said second region in which the direction of propagation of said waves is affected by doping and a doping level in said region operable to reduce the effect of temperature on the propagation time of said acoustic waves.

10. The device of claim 8 wherein said substrate is n-type silicon having a doping level at least in said second region in the range of $10^{18}$ to $10^{21}$ atoms/cc and having at least in said second region a crystallographic orientation perpendicular to the surface of [1$\bar{1}$0] and in the direction of wave propagation of [110].

* * * * *

UNITED STATES PATENT AND TRADEMARK OFFICE
CERTIFICATE OF CORRECTION

PATENT NO. : 4,358,745
DATED : Nov. 9, 1982
INVENTOR(S) : Robert W. Keyes

It is certified that error appears in the above—identified patent and that said Letters Patent is hereby corrected as shown below:

[57] ABSTRACT, line 10, "[1$\bar{1}$0]" should read --[110]--.

[57] ABSTRACT, line 11, "[110]" should read --[1$\bar{1}$0]--.

Column 7, line 14, "[110]" should read --[1$\bar{1}$0]--.

Column 7, line 14, "[1$\bar{1}$0]" should read --[110]--.

Signed and Sealed this

Third Day of May 1983

[SEAL]

Attest:

Attesting Officer

GERALD J. MOSSINGHOFF
Commissioner of Patents and Trademarks